United States Patent [19]
Nagai et al.

[11] Patent Number: 5,315,153
[45] Date of Patent: May 24, 1994

[54] PACKAGES FOR SEMICONDUCTOR INTEGRATED CIRCUIT

[75] Inventors: Yuji Nagai, Komae; Eiki Tanikawa, Urayasu; Hisao Ohshima, Okegawa; Kazushige Kato, Atsugi, all of Japan

[73] Assignees: Toyo Aluminium Kabushiki Kaisha, Osaka; Kabushiki Kaisha Enplas, Saitama, both of Japan

[21] Appl. No.: 689,902

[22] PCT Filed: Jan. 12, 1990

[86] PCT No.: PCT/JP90/00037

§ 371 Date: May 29, 1991

§ 102(e) Date: May 29, 1991

[30] Foreign Application Priority Data

Sep. 29, 1989 [JP] Japan .................. 1-254853

[51] Int. Cl.⁵ .................. H01L 23/28
[52] U.S. Cl. .................. 257/701; 257/704; 257/710

[58] Field of Search .................. 357/72, 73, 80; 257/697, 700, 722, 682, 704, 710, 701

[56] References Cited

U.S. PATENT DOCUMENTS

| | | | |
|---|---|---|---|
| 4,729,010 | 3/1988 | Tsuchiya et al. | 357/70 |
| 4,965,660 | 10/1990 | Ogihara et al. | 357/72 |
| 5,055,914 | 10/1991 | Shimuzu et al. | 257/697 |
| 5,072,284 | 12/1991 | Tamura et al. | 357/72 |
| 5,117,281 | 5/1992 | Katsuraoka | 257/722 |

Primary Examiner—Rolf Hille
Assistant Examiner—Roy Potter
Attorney, Agent, or Firm—Larson and Taylor

[57] ABSTRACT

A ceramic package comprising an aluminum nitride substrate, an IC on the substrate, leads attached to the substrate, a metal cap covering the substrate, a resin layer for adhesion of the above elements, and a water-resistant coating on the inner surface of the resin layer.

14 Claims, 1 Drawing Sheet

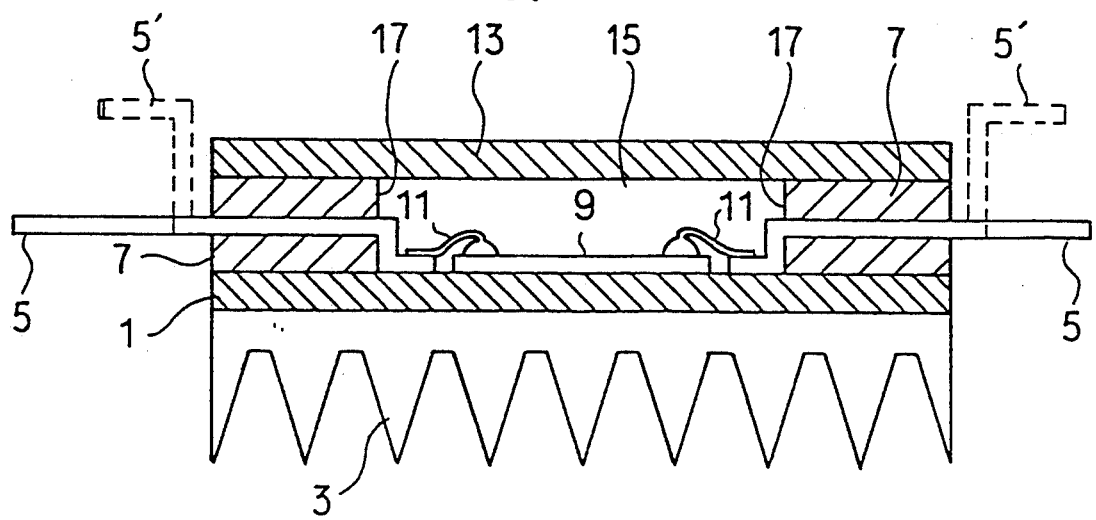
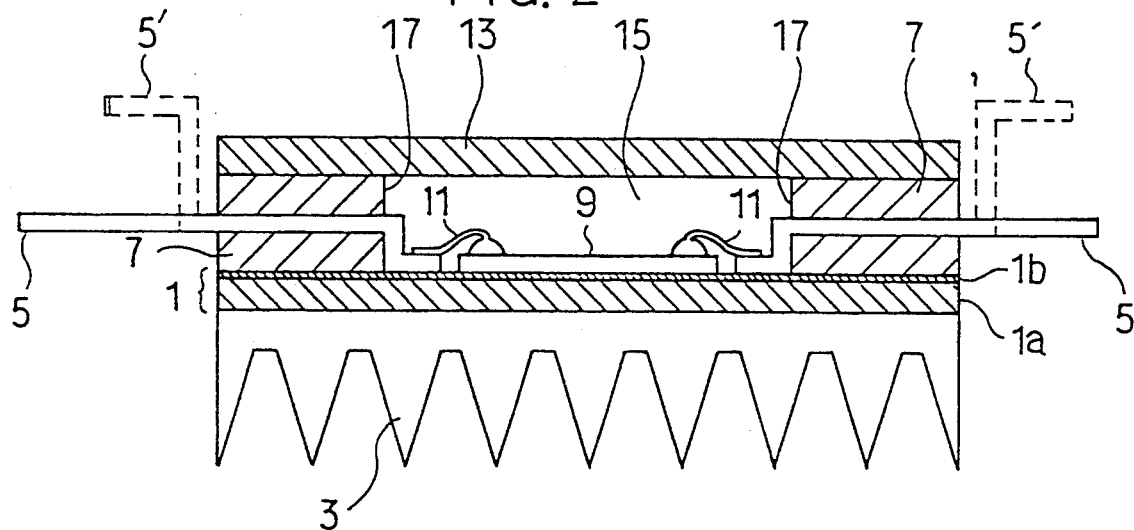
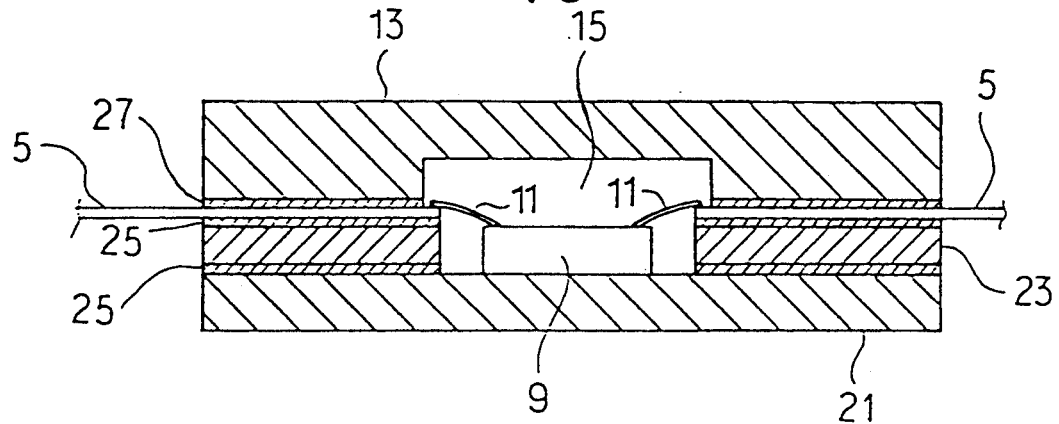

PACKAGES FOR SEMICONDUCTOR INTEGRATED CIRCUIT

INDUSTRIAL FIELD OF THE INVENTION

The present invention relates to a package for semiconductor integrated circuit.

PRIOR ART AND PROBLEMS THEREOF

Conventional methods for fabricating a ceramics package generally comprise forming a specific wiring on green sheets, calcining the combination of green sheets, adhereing each lead to the side surface, bottom surface and other portions of the calcined package, electroplating the leads and the wiring portion, and sealing the package with a resin (see, e.g., Japanese Examined Utility Model Publication No. 8361/1984.).

However, such methods entail the following problems. The methods comprise a great number of steps and a low yield results at each step. For production of a package having many pins, the method involves more complicated steps, and thus entails difficulty in providing products at low costs.

On PLCC, flat packages and other thin packages including numerous pins, the water present in the resin used for sealing and the moisture in the air gradually permeate into IC chips, posing problems of, e.g., insufficiency in resistance to water.

Further disadvantageously, since it is necessary to calcine the green sheets at a high temperature of 1000° C. or higher, noble metal-based materials, rare earth type materials or like expensive materials must be used as materials for wiring.

For users' part, the following additional drawback exists. An expensive ceramics package must be used even when a high reliability and a high thermal conductivity among the characteristics of ceramics packages are not always needed, but only a high thermal conductivity is essentially utilized.

MEANS FOR SOLUTION OF THE PROBLEMS

We conducted extensive research in view of the foregoing current state of the prior art. Consequently, we found that the prior art problems can be considerably alleviated by the following technique. A lead frame or a flexible printing board is adhered to a ceramics substrate with a resin layer, a semiconductor integrated circuit is formed on the ceramics substrate in the conventional manner, and the hollow space surrounding the semiconductor integrated circuit is sealed with a cap.

The present invention provides a ceramics package for a semiconductor integrated circuit, the package comprising:

a ceramics substrate, a semiconductor integrated circuit formed on the ceramics substrate, a lead frame or a flexible printing board attached with a resin layer to the ceramics substrate, and a hollow space surrounding the semiconductor integrated circuit which space is sealed with a cap.

EXAMPLES

The present invention will be described below in more detail with reference to the following embodiments which are shown in the accompanying drawings.

FIG. 1 is a sectional view schematically showing an embodiment of the package for semiconductor integrated circuit according to the invention;

FIG. 2 is a sectional view schematically showing another embodiment of the package for semiconductor integrated circuit according to the invention; and FIG. 3 is a sectional view schematically showing a further embodiment of the package for semiconductor integrated circuit according to the invention.

In FIG. 1, a substrate 1 is made of ceramics and has fins 3 when so required. A lead frame 5 is adhered to the substrate 1 with a resin layer 7 to form a hollow space 15. The materials for the ceramics substrate 1 can be those known, and include, for example, aluminum nitride, alumina, boron nitride, beryllia, silicon nitride, etc. Usable as the material for the lead frame 5 are copper, copper alloy, iron, iron alloy (e.g. 42 alloy) and the like. Useful materials for the resin layer 7 can be those used for sealing a semiconductor device, such as epoxy resin, phenolic resin, polyimide resin, silicone resin, fluoro plastics, polybutadiene, polyester resin, polyphenylene sulfide resin, etc. An alternative to the lead frame 5 is a flexible printing board having wiring formed on a plastics sheet (e.g. polyimide sheet).

The ceramics substrate 1 to which the lead frame 5 is attached as above is transferred to a step for forming a semiconductor device. In this step, an IC chip 9 is fixed to a recess defined by the lead frame 5 on the ceramics substrate 1 and the IC chip 9 is brought into connection with the lead frame 5 by a thin wire of aluminum 11 as a bonding wire by a conventional method. Thereafter, for sealing the hollow space 15, a cap 13 made of a metal (e.g. nickel, 42 alloy, silver-plated copper plate or the like), ceramics, glass or resin is joined to the resin layer 7 with an adhesive (such as epoxy resin type adhesives) to form a package for semiconductor integrated circuit. Unlike the conventional resin-molded products, the hollow space 15 in the present invention serves as a barrier which prevents the permeation of moisture. If an inner wall portion 17 of the resin layer 7 which defines the hollow space 15 is coated with a water-resistant material, the water resistance of the package as a whole can be improved effectively. The coating of the water-resistant material is provided by forming an oxide ceramics layer by means of spray coating, a resin layer by the application of imide resin, silicone resin or the like, or a metal oxide layer by metal alkoxide method. When required, the end portion of the lead frame 5 may be folded as indicated by broken lines 5'.

The package for semiconductor integrated circuit according to the invention as shown in FIG. 2 is the same as that shown in FIG. 1 except that the substrate is a composite material composed of a thin ceramics layer 1b provided on a metal plate 1a. Accordingly, the term "ceramics substrate" used herein also means a composite material composed of a thin ceramics layer 1b formed on a metal plate 1a. Examples of the material for the metal plate 1a are aluminum, iron, copper, nickel, alloys of these metals, etc. Materials for the thin ceramics layer 1b can be those known, such as aluminum nitride, alumina, boron nitride, beryllia, silicon nitride, etc.

FIG. 3 shows an embodiment of the invention which exhibits excellent properties when used, in particular, as a package for an ultra high-frequency semiconductor integrated circuit. The properties of the package itself greatly affects the properties of the semiconductor integrated circuit. More specifically, the properties of the circuit are easily affected to a large extent by the dielectric constant of the material of the package and electrical resistance and impedance of the bonding wire used. Consequently, used as the material for the substrate 21 of the package as shown in FIG. 3 is aluminum nitride which has substantially the same coefficient of thermal expansion as the silicon used as a material for semiconductor and which possesses a low dielectric constant. Since the level of bonding location can be adjusted by interposing a spacer 23 made of a material low in dielectric constant (e.g. aluminum nitride), the length of the bonding wire 11 can be effectively shortened, whereby the circuit is less affected by the characteristics of the wire. More specifically, since the spacer 23 has dimensions so confined that the lead frame 5 is positioned slightly higher than the upper surface of the ultra high-frequency IC chip 9, the wire extends substantially straight over a minimized distance. In FIG. 3, an adhesive 25 (e.g. epoxy-type adhesive) is used to adhere the spacer 23 to the substrate 21 made of aluminum nitride and to the lead frame 5. An adhesive 27 (e.g. epoxy-type adhesive) is intended to adhere the cap 13 to the lead frame 5 for sealing the hollow space 15. A flexible printing board having wiring formed on a plastics sheet (e.g. sheet of polyimide) may substitute for the lead frame 5 in the package for ultra high-frequency semiconductor integrated circuit as shown in FIG. 3.

EFFECT OF THE INVENTION

The following remarkable effects can be achieved according to the present invention.

(a) The package for semiconductor integrated circuit can be produced at reduced costs.

(b) The package for semiconductor integrated curcuit according to the invention is excellent in thermal conductivity and superior in reliability to products molded from resin.

(c) Since the hollow space between the ceramics substrate and the cap prevents the spread of water, the water resistance of the package is remarkably improved over the products molded from resin.

(d) When a water-resistant layer is formed on the inner wall defining the hollow space in which the IC chip is installed, the obtained package for semiconductor integrated circuit is further enhanced in resistance to water.

(e) With the package for semiconductor integrated circuit having the structure as shown in FIG. 3, the IC chip exhibits excellent characteristics even in ultra high-frequency band because of the low dielectric constant and high thermal conductivity of the aluminum nitride used for the substrate and the spacer, and due to the shortened length of the bonding wire.

Stated more specifically, the calorific power is reduced with the decrease of the electric power consumed, and the temperature of the semiconductor integrated circuit is prevented from rising due to the high heat dissipation capacity of the aluminum nitride substrate. In consequence, the semiconductor integrated circuit can be properly and accurately operated in ultra high-frequency band.

We claim:

1. A ceramic package for a semiconductor integrated circuit, the package comprising:
    a substrate made of aluminum nitride,
    a semiconductor integrated circuit formed on the substrate,
    leads attached to the substrate,
    a metal cap covering the substrate in a manner that forms a hollow space surrounding the semiconductor integrated circuit between the substrate and the metal cap,
    a resin layer for adhering the substrate, the leads and the metal cap to each other, and
    a coating of water-resistant material on the inner surface of the resin layer which defines the hollow space.

2. A ceramic package for semiconductor integrated circuit according to claim 1 wherein the resin layer is selected from the group consisting of epoxy resin, phenolic resin, polyimide resin, silicone resin, fluoro plastics, polybutadiene, polyester resin and polyphenylene sulfide resin.

3. A ceramic package for semiconductor integrated circuit according to claim 1 wherein the substrate is a composite material composed of a thin aluminum nitride layer formed on a metal material.

4. A ceramic package for semiconductor integrated circuit according to claim 3 wherein the metal material is selected from the group consisting of aluminum, iron, copper, nickel and alloys of these metals.

5. A ceramic package for semiconductor integrated circuit according to claim 1 wherein the coating of water-resistant material is formed by spray coating of a ceramic oxide.

6. A ceramic package for semiconductor integrated circuit according to claim 1 wherein the coating of water-resistant material is formed by application of imide resin.

7. A ceramic package for semiconductor integrated circuit according to claim 1 wherein the coating of water-resistant material is formed by application of silicone resin.

8. A ceramic package for semiconductor integrated circuit according to claim 1 wherein the coating of water-resistant material is a coating of metal oxide.

9. A ceramic package for ultra high-frequency semiconductor integrated circuit, the package comprising:
    a substrate made of aluminum nitride,
    a semiconductor integrated circuit formed on the substrate,
    leads attached to the substrate,
    a metal cap covering the substrate in a manner that forms a hollow space surrounding the semiconductor integrated circuit between the substrate and the metal cap,
    a spacer made of aluminum nitride and position between the substrate and the leads
    a resin layer for adhering the substrate, the spacer, the leads and the metal cap to each other, the spacer and the resin layer thereunder rendering the bonding position on the leads slightly higher than on the semiconductor integrated circuit device, and
    a coating of water-resistant material on the inner surface of the resin layer and the spacer which define the hollow space.

10. A ceramic package for semiconductor integrated circuit according to claim 9 wherein the resin layer is selected from the group consisting of epoxy resin, phenolic resin, polyimide resin, silicone resin, fluoro plastics, polybutadiene, polyester resin and polyphenylene sulfide resin.

11. A ceramic package for semiconductor integrated circuit according to claim 9 wherein the coating of water-resistant material is formed by spray coating of a ceramic oxide.

12. A ceramic package for semiconductor integrated circuit according to claim 9 wherein the coating of water-resistant material is formed by application of imide resin.

13. A ceramic package for semiconductor integrated circuit according to claim 9 wherein the coating of water-resistant material is formed by application of silicone resin.

14. A ceramic package for semiconductor integrated circuit according to claim 9 wherein the coating of water-resistant material is a coating of metal oxide.

* * * * *